United States Patent [19]
Roth et al.

[11] Patent Number: 5,543,339
[45] Date of Patent: Aug. 6, 1996

[54] PROCESS FOR FORMING AN ELECTRICALLY PROGRAMMABLE READ-ONLY MEMORY CELL

[75] Inventors: Scott S. Roth; Howard C. Kirsch, both of Austin, Tex.

[73] Assignee: Motorola, Inc., Schaumburg, Ill.

[21] Appl. No.: 296,908

[22] Filed: Aug. 29, 1994

[51] Int. Cl.$^6$ ................................................ H01L 21/8247
[52] U.S. Cl. .............................. 437/43; 437/191; 437/927
[58] Field of Search ............................ 437/43, 44, 191, 437/927; 148/DIG. 73

[56] References Cited

U.S. PATENT DOCUMENTS

| | | | |
|---|---|---|---|
| 4,700,457 | 10/1987 | Matsukawa | 437/52 |
| 5,077,225 | 12/1991 | Lee | 437/24 |
| 5,150,276 | 9/1992 | Gonzalez et al. | 361/313 |
| 5,155,657 | 10/1992 | Oehrlein et al. | 361/313 |
| 5,158,905 | 10/1992 | Ahn | 437/52 |
| 5,164,337 | 11/1992 | Ogawa et al. | 437/228 |
| 5,231,041 | 7/1993 | Arima et al. | 437/43 |
| 5,262,662 | 11/1993 | Gonzalez et al. | 257/307 |
| 5,395,779 | 3/1995 | Hong | 437/43 |
| 5,399,516 | 3/1995 | Bergendahl et al. | 437/43 |

FOREIGN PATENT DOCUMENTS

0449000A2  10/1991  European Pat. Off. .

OTHER PUBLICATIONS

Taguchi, et al.; "A 40-ns 64-Mb DRAM with 64-b Parallel Data Bus Architecture;" IEEE Jour. of Solid-State Circuits; vol. 26, No. 11, pp. 1493-1497 (Nov. 1991).

Itabashi, et al.; "A Split Wordline Cell For 16Mb SRAM Using Polysilicon Sidewall Contacts;" IEDM; pp. 477-480 (1991).

Kume, et al.; "A 1.28 µm**2 Contactless Memory Cell Technology for a 3-V Only 64 Mbit EEPROM;" IEDM; pp. 991-993 (1992).

*Primary Examiner*—Chandra Chaudhari
*Attorney, Agent, or Firm*—George R. Meyer

[57] ABSTRACT

A floating gate (51) is formed to have a cavity (52) that increases the capacitive coupling between the floating gate (51) and a control gate for the memory cell. The memory cell may be used in EPROM, EEPROM, and flash EEPROM arrays and may be programmed and erased by hot carrier injection, Fowler-Nordheim tunneling or the like. The process sequence for forming the cavity (52) of the floating gate (51) has good process margin allowing some lithographic misalignment. In one embodiment, a multi-tiered floating gate may be formed. The multi-tier structure allows the capacitive coupling to further increase without occupying more area.

11 Claims, 6 Drawing Sheets

PROCESS FOR FORMING AN ELECTRICALLY PROGRAMMABLE READ-ONLY MEMORY CELL

FIELD OF THE INVENTION

The present invention relates to semiconductor devices, and in particular, to electrically programmable read-only memory cells.

BACKGROUND OF THE INVENTION

Conventional electrically programmable read-only memory (EPROM) types of cells typically have control gates that overlie the top or the top and sides of floating gates. When a control gate overlies only the top of the floating gate member, the capacitive coupling between the floating gate member and control gate member typically does not exceed about 50% of the total floating gate capacitance (i.e., capacitance ratio=50%). When a control gate lies adjacent to the top and sides of the floating gate, the capacitive coupling ratio may increase to about 70%.

An attempt to increase capacitive coupling ratio may include the use of a control gate that lies adjacent to the top, sides, and part of the bottom of a T-shaped floating gate. The formation of this type of device is complex and may include two deposition steps and two patterning steps. Further, the intergate dielectric layer (between the control gate and the floating gate) may include two distinct regions, and its formation may require three steps. For example, one region may be between the bottom of the floating gate and an underlying portion of the control gate, and the other region may be between the top of the floating gate and an overlying portion of the control gate. Extra processing steps typically lower yield, raise substrate cost, increase cycle time, and are generally undesired.

SUMMARY OF THE INVENTION

The present invention includes an electrically programmable read-only memory cell comprising a semiconductor substrate, a floating gate, an intergate dielectric layer, and a control gate. The floating gate overlies the substrate and has a first member, a second member, and a third member, wherein the first, second and third member define a cavity. The cavity overlies the first member, underlies the second member, and lies adjacent to the third member. The intergate dielectric layer lies adjacent to the floating gate and within the cavity. The control gate lies adjacent to the intergate dielectric layer, and a portion of the control gate lies within the cavity. The present invention also includes a process for forming the memory cell.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawing, in which like references indicate similar elements, and in which.

DETAILED DESCRIPTION OF THE DRAWINGS

An electrically programmable read-only memory (EPROM) cell may be formed to have a relatively large capacitive coupling without having a large memory cell. The structure may be used to form electrically erasable and electrically programmable read-only memory (EEPROM) cells and a flash erasable EEPROM array. EEPROMs and flash erasable EEPROMs are specific types of EPROMs.

Floating Gate with a Cavity

Figure 1:
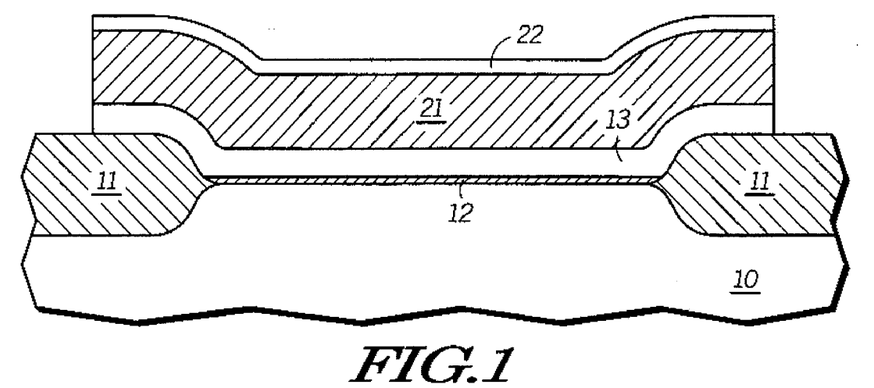
FIG. 1 includes an illustration of a cross-sectional view of a portion of a semiconductor substrate after forming a first conductive member, an insulating member and a second conductive member.

FIG. 1 includes a cross-sectional view of a portion of a semiconductor substrate 10 where a floating gate memory cell is subsequently formed. Field isolation regions 11 are formed within the substrate 10 by a conventional method. A gate dielectric layer 12 is formed between the field isolation regions 11 and over the substrate 10. The gate dielectric layer 12 may include silicon dioxide, silicon nitride, a nitrided oxide, or a composite of layers. For an EEPROM or a flash EEPROM that is programmed or erased by Fowler-Nordheim tunneling, the gate dielectric layer 12 is a tunnel dielectric layer (a specific type of gate dielectric layer) and may have thickness in a range of 50–150 angstroms. If an EPROM is formed that will not be programmed or erased by tunneling, the gate dielectric layer 21 may have a thickness as high as about 500 angstroms or possibly even higher.

Three layers are formed by depositing the layers over the substrate 10 including the field isolation regions 11 and the gate dielectric layer 12. The three layers are patterned to form a first conductive member 13, an insulating member 21, and a second conductive member 22 as shown in FIG. 1. In this particular embodiment, the three layers are patterned such that the edges of the three layers are coincident with one another. In other embodiments, the first conductive member 13 may be formed separately from the insulating member 21 and the second conductive member 22. The edges of the members 13, 21, and 22 do not need to be coincident with one another. Several other structures similar to the one shown in FIG. 1 are formed over other portions of the substrate 10.

The first and second conductive members 13 and 22 typically include a silicon or metal-containing material or may even include silicon germanium. If the layers include a silicon material, the layers typically include a dopant that is incorporated by in-situ doping. In other embodiments, a separate ion implant or furnace doping step may be used to dope the layers for the first and second conductive members 13 and 22. The first and second conductive members 13 and 22 may include different materials, but both need to be relatively conductive.

The insulating member 21 may include oxide or silicon nitride or may even be a doped oxide including borophosphosilicate glass (BPSG), phosphosilicate glass (PSG), or the like. This insulating member 21 typically has a thickness in a range of 500–5000 angstroms. In an alternate embodiment, the insulating member 21 may include a non-insulating material, as long as, some of that material may be selectively removed with respect to the first and second conductive members 13 and 22. For example, the insulating member 21 may be replaced with a titanium member, and the first and second conductive members 13 and 22 include doped polycrystalline silicon (polysilicon). Although some of the titanium may react with the first and second conductive members 13 and 22 during normal processing conditions to form a silicide, the remaining titanium may be removed using ammonium hydroxide and hydrogen peroxide, which should not attack any titanium silicide or the doped polysilicon.

Figure 2:
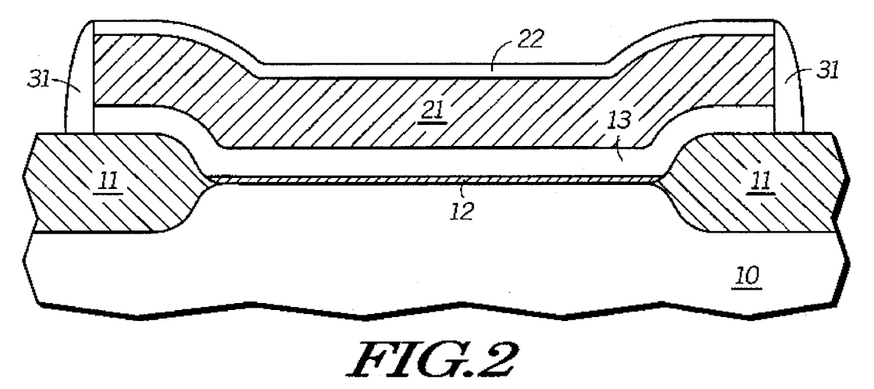
FIG. 2 includes an illustration of a cross-sectional view of the substrate of FIG. 1 after forming conductive spacers.

A conductive sidewall spacer 31 is formed over the field isolation regions 11 and adjacent to the members 13, 21 and 22 as shown in FIG. 2. The spacer 31 may include any of the materials that were listed for the first and second conductive members 13 and 22. The spacer 31 is formed by conformally depositing a layer that is either conductive upon formation or can subsequently be made conductive and anisotropically etching it. The layer is typically deposited to a thickness in a range of 500–2000 angstroms. Note that the spacers 31 provide mechanical support for the member 22 after the members 21 are subsequently removed. In this particular embodiment, spacers 31 may include silicon germanium that generally has a lower dopant activation energy and allows greater diffusion compared to polysilicon or amorphous silicon.

Figure 3:
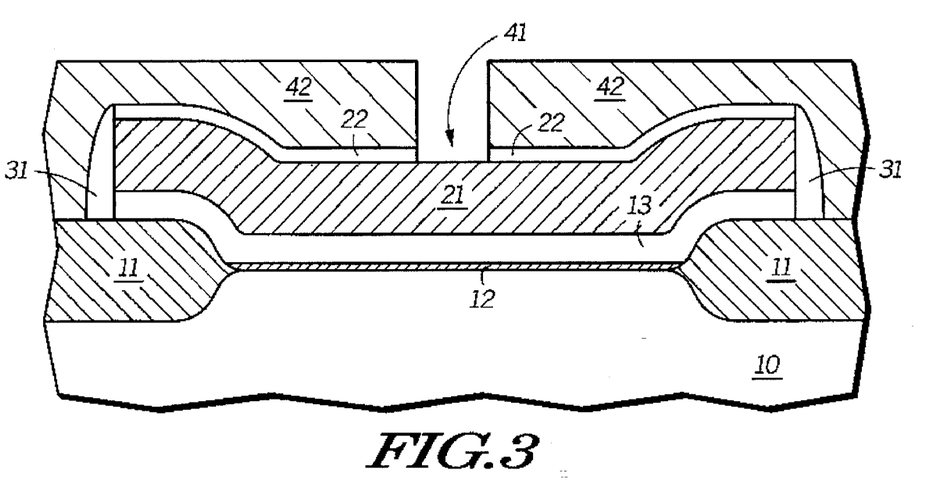
FIG. 3 includes an illustration of a cross-sectional view of the substrate of FIG. 2 after forming a masking layer and an opening through the second conductive member.

A masking layer 42 is formed over the second conductive member 22, spacers 31, and field isolation regions 11 as shown in FIG. 3. An opening is formed over the second conductive member 22. Typically, the opening has a width in a range of about 0.5–1.0 micron. In alternate embodiments, the width of opening may be varied beyond the range given. A portion of the second conductive member 22 is exposed beneath the openings in the masking layer. The exposed portion of the second conductive member 22 is etched to form opening 41 through the member 22 that is substantially in line with the opening within the masking layer 42. The width of the opening 41 is in a range about the same as the masking layer opening.

Before removing the masking layer 42, the insulating member 21 is removed. If the insulating member 21 includes oxide, the insulating member 21 is removed using an oxide etchant, such as a buffered oxide etch (an aqueous solution including hydrogen fluoride and ammonium fluoride) and the like or a dry isotropic oxide etchant, such as $C_2F_6$ and the like. After removing the insulating member 21, the masking layer 42 is removed.

Figure 4:
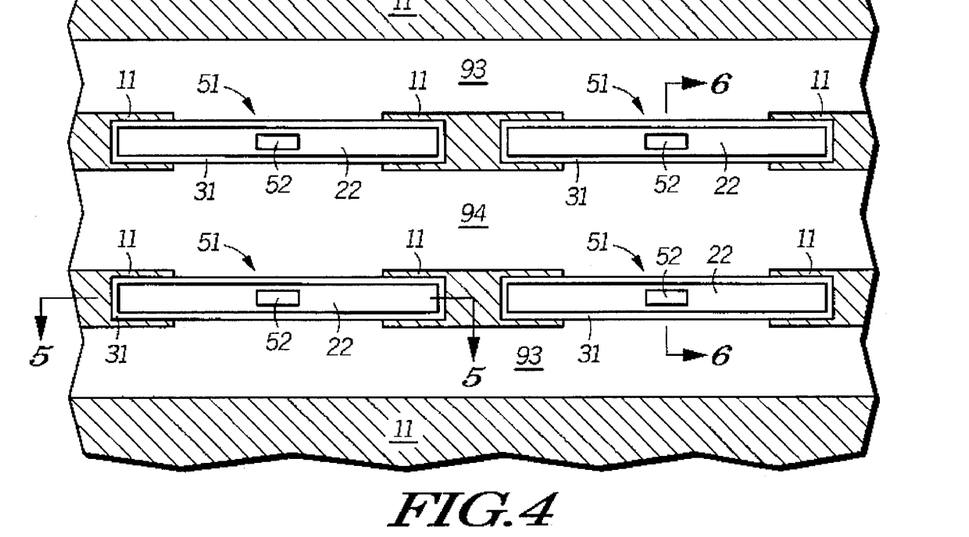
FIGS. 4–6 include illustrations of plan and cross-sectional views of the substrate of FIG. 3 after forming a floating gate with a cavity.
Figure 5:
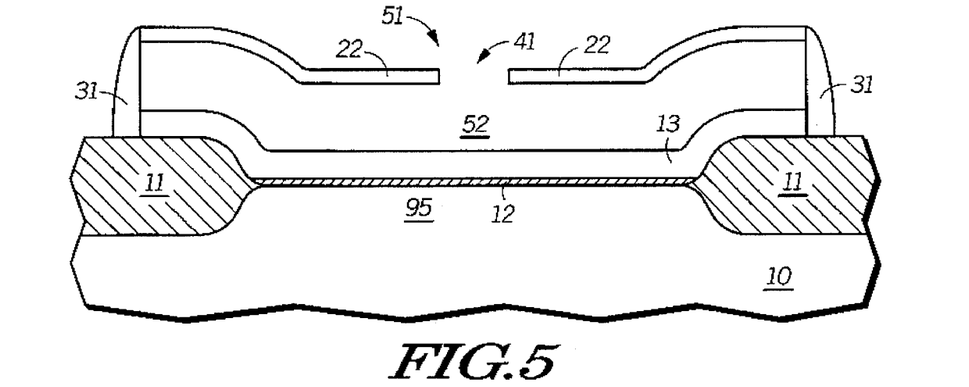
Figure 6:
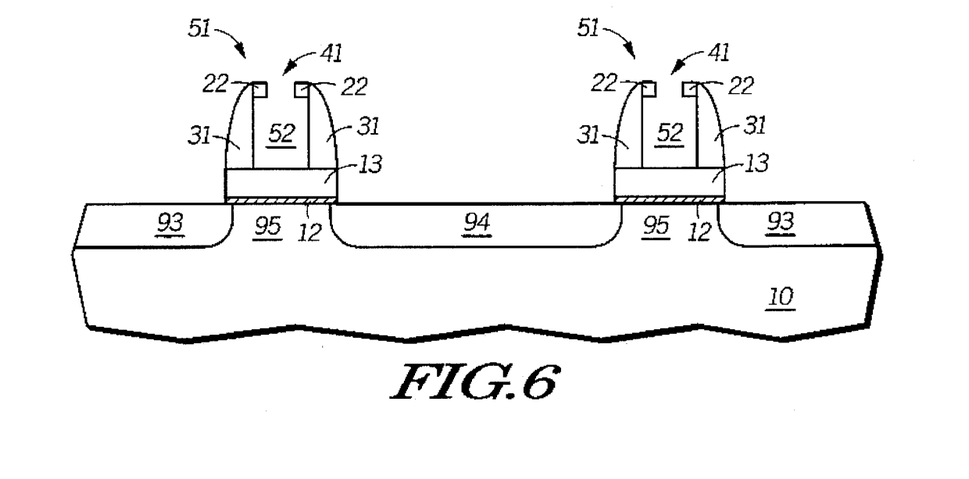

FIGS. 4–6 illustrate the device at this point in processing. FIG. 4 includes an illustration of a plan view including four separate floating gates 51. Each floating gate 51 includes three conductive members, namely one of the first conductive members 13, one of the second conductive members 22, and one of the spacers 31. Note that cavities 52 underlie the second conductive members 22. The cavities 52 are formed when the insulating members 21 are removed and have shapes that are defined by the first and second conductive members 13 and 22 and the spacers 31. The spacers 31 surround the second conductive members 22 as seen in FIG. 4. The lengths of the floating gates 51 are substantially parallel with one another. Drain regions 93 and source region 94 are then formed within the substrate 10. Channel regions 95 (not shown in FIG. 4) are located in the substrate between the drain and source regions 93 and 94. The drain and source regions 93 and 94 have shapes that are essentially strips whose lengths extend from side to side in FIG. 4. In this embodiment, the drain and source regions 93 and 94 are buried bit lines for several memory cells within the memory array. The memory array typically includes several other source and drain regions similar to those shown in FIG. 4.

Figure 7:
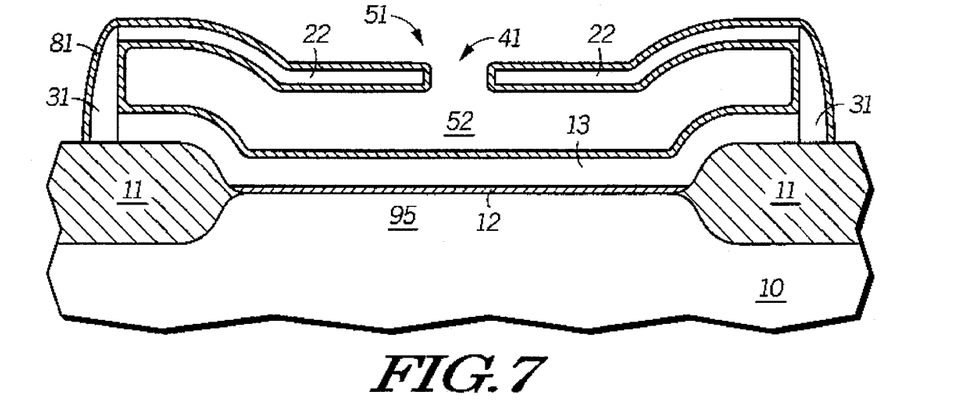
FIG. 7 includes an illustration of a cross-sectional view of the substrate of FIGS. 4–6 after forming an intergate dielectric layer.

FIGS. 5 and 6 include illustrations of cross-sectional views of portions of the memory array as indicated by the sectioning lines in FIG. 4. The view in FIG. 5 extends along the length of one of the floating gates 51. The relationships of the various members of the floating gate 51, cavity 52, and opening 41 are seen in FIG. 5. The other floating gates 51 are similar to the one shown in FIG. 5. FIG. 6 is a view that is substantially perpendicular to the cross-sectional view as seen in FIG. 5. Note that the width and lengths of the openings 41 are narrower and shorter than the widths and lengths of the cavities 52 as shown in FIGS. 6 and 7. The channel regions 95 underlie the first conductive members of the floating gates 51.

An intergate dielectric layer 81 is formed on the exposed surfaces of the first and second conductive members 13 and 22 and spacer 31 as shown in FIG. 7. Note that the intergate dielectric layer 81 is formed within the cavity 52, too. In this embodiment, the intergate dielectric layer is a thermally grown oxide. In other embodiments, the intergate dielectric layer 81 may include a deposited oxide or a composite including a combination of a thermal and deposited oxide, an oxide-nitrideoxide composite, or the like. Regardless of material, the intergate dielectric layer 81 typically has an electrically measured equivalent oxide thickness in a range of 50–300 angstroms.

Figure 8:
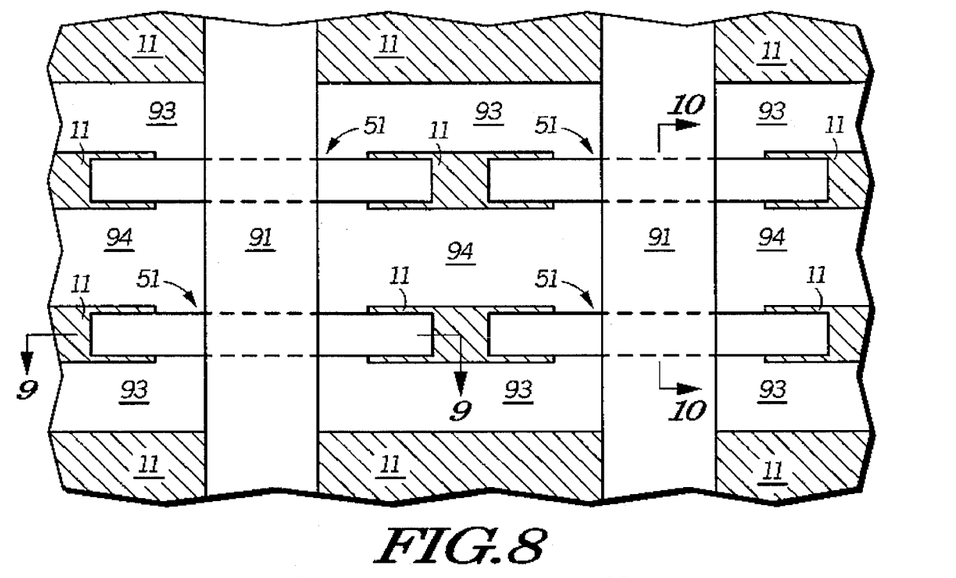
FIGS. 8–10 include illustrations of plan and cross-sectional views of the substrate of FIG. 7 after forming a word line over the floating gate and within the cavity.
Figure 9:
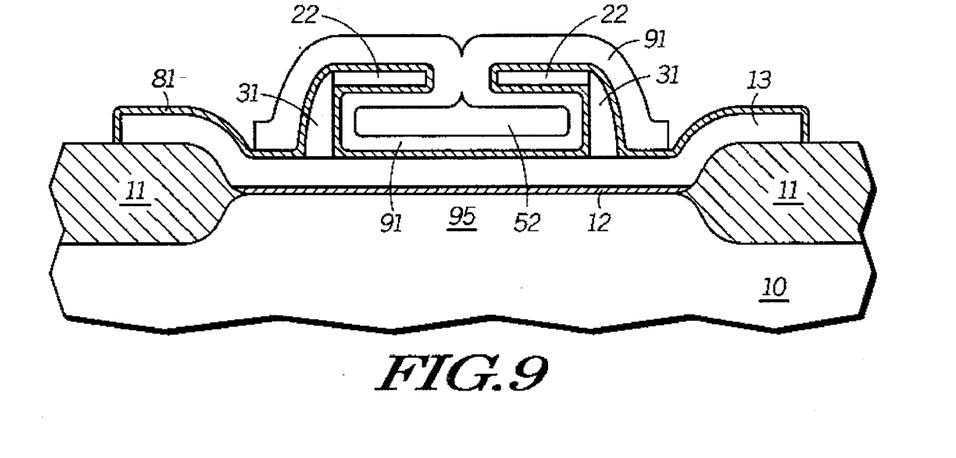
Figure 10:
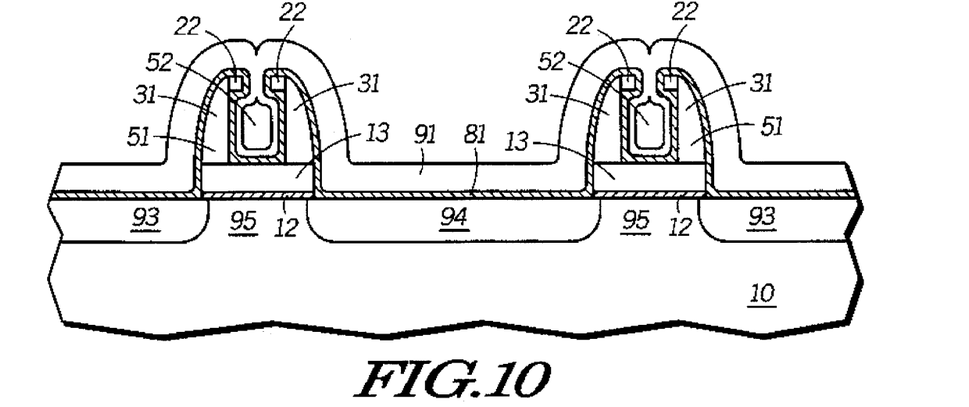

Word lines 91 are formed over the intergate dielectric layer 81 as shown in FIGS. 8–10. The word lines 91 are formed by depositing and patterning a silicon or metal-containing layer or even silicon germanium. The word lines 91 partially fill the cavities 52. If a silicon layer is used, it is typically in-situ doped, so that the silicon layer is conductive. After depositing the layer, it is patterned to form the word lines 91. The portions of the word lines 91 that capacitively couple to the floating gates 51 form the control gates for the memory cells. FIG. 8 is a plan view of the memory cells at this point of the process. Word lines 91 have lengths that generally extend from top to bottom in FIG. 8. The portions of the floating gates 51 that underlie the word lines 91 are illustrated with dashed lines. The length of the drain and source regions 93 and 94 (bit lines) are perpendicular to the lengths of the word lines 91.

FIGS. 9 and 10 include illustrations of cross-sectional views of portions of the memory array as indicated by the sectioning lines in FIG. 8. FIG. 9 includes a cross-sectional view of the memory cell substantially perpendicular to the length of the word lines 91. The word lines 91 are formed over the floating gates 51 and within the cavity 52. During the deposition of the layer that forms the word lines 91, the opening 41 (not identified in FIG. 9) above the cavity 52 has been sealed shut. This occurs because the layer from which the word line 91 is formed is deposited on all exposed surfaces including the sides adjacent to the second conductive member 22 that is immediately adjacent to the opening 41 (see FIG. 7). The word line 91 only partially fills the cavity 52. In alternative embodiments, the cavity 52 may be completely filled. If the cavity 52 is to be filled, the opening 41 may need to be larger. FIG. 10 includes an illustration that is substantially parallel to the length of the word line 91. The word line 91 overlies portions of the doped regions 93 and 94 and is separated from them by the intergate dielectric layer 81.

Figure 11:
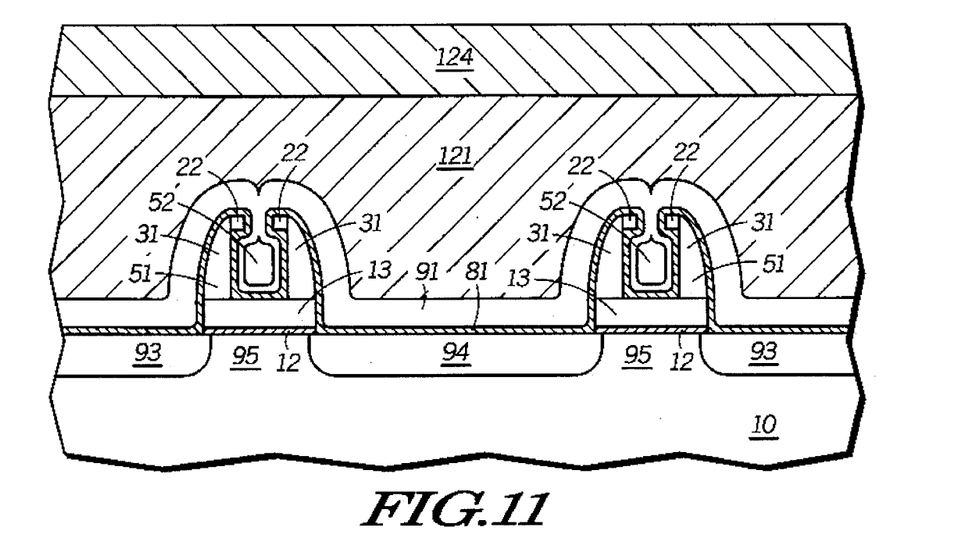
FIG. 11 includes an illustration of a cross-sectional view of the substrate of FIGS. 8–10 after forming a substantially completed device.

The device is further processed to produce a substantially completed device as shown in FIG. 11. An insulating layer 121 is formed over the word line 91. Contact openings within the insulating layer 121, contact plugs, and interconnects are formed, but are not shown in FIG. 11. The contact plugs and interconnects allow electrically connections to be made to the drain and source regions 93 and 94 and the word lines 91. A passivation layer 124 is formed over the insulating layer 121, contact plugs, and interconnects. Other electrical connections to other portions of the device and additional levels of insulating layers and interconnects may be formed, if needed, prior to forming the passivation layer 124.

The embodiment may be used to form a "contactless" memory array. By "contactless," it is meant that only one contact is made to a source region or a drain region that is shared by many different memory cells. For example, a memory may have a row of about 1000 memory cells. One contact is made to the source region 93 and drain region 94 for the memory cells lying along that row. The memory array may be configured such that contacts are only formed near the edge of the memory array and not within the center of the memory array. Contactless memory arrays may be smaller than conventional memory arrays having one contact for each memory cell or every two memory cells.

Programming of the memory cells as shown in FIG. 11 is performed by hot carrier injection (i.e., hot electrons). To program one of the memory cells, the substrate 10 and source region 94 of the memory cell to be programmed are at about ground potential (zero volts), the drain region 93 of the memory cell to be programmed is at a potential of about 5–7 volts, and the word line 91 of the memory cell to be programmed is at a potential of about 6–8 volts. Erasing is performed by Fowler-Nordheim tunneling. To erase the memory cell, the word line 91 of the cell to be erased is at a potential of about ground potential while the drain region 93 or source region 94 of the memory cell to be erased is at a potential of about 10–20 volts. Other potentials for programming and erasing are possible. To improve erasing characteristics, the source region 94 may have a graded junction to decrease the risk of a junction breakdown between the source region 94 and the substrate 10.

The previously described embodiment may be used to form EPROM or flash EEPROM cells. In addition the memory array and memory cells may be configured such that they may be individually erased. Spacers (not shown) may be formed adjacent to the floating gates 51 prior to forming the source regions 94, so that the source regions 94 are formed, so that they do not underlie any portion of the floating gates 51. In this manner, the word lines 91 will be merged select/control gates for the memory cells. Part of each channel region 95 underlies a floating gate 51, and another part of the channel region 95 underlies a merged select/control gate, but not the floating gate 51 Therefore, EEPROM cells (individually erasable) may be formed. Still, the merged select/control gate configuration may be used for flash erasing also. Separate select and control gates may be used, but typically results in a larger cell size.

The memory cells may be programmed by Fowler-Nordheim tunneling. Also, if the flash EEPROM cells do not have a select gate and are susceptible of forming over-erased cells, the memory cells may be repaired by a conventional repairing process.

Figure 12:
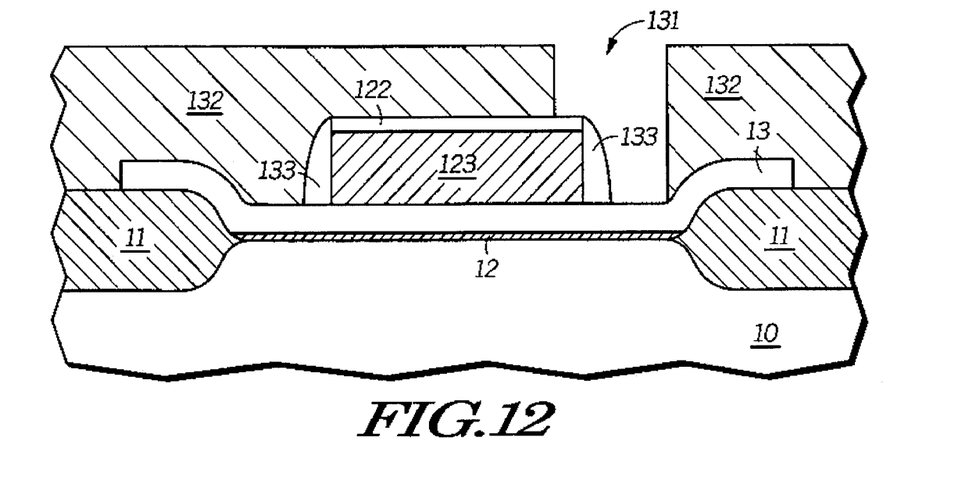
FIGS. 12–13 include illustrations of cross-sectional views of the substrate of FIG. 2 to show how misalignment affects the shape of the floating gates.
Figure 13:
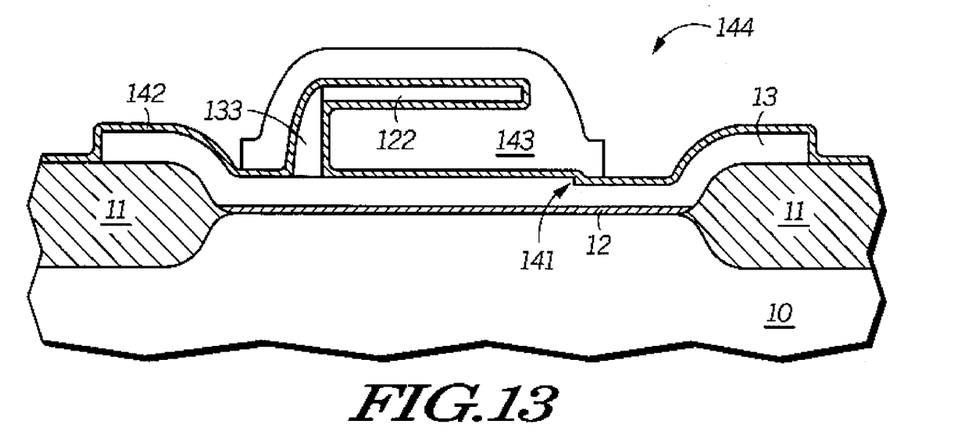

FIGS. 12 and 13 illustrate the consequences of a misaligning opening in a masking layer prior to forming the cavities of the floating gates. FIG. 12 is similar to FIG. 3. Unlike FIG. 3, the first conductive member 13 is formed separately from the insulating member 123 and the second conductive members 122. As illustrated in FIG. 12, the masking layer opening 131 of masking layer 132 is aligned such that the openings 131 are formed over the first and second conductive members 13 and 122 and spacer 133 that surrounds members 122 and 123.

An isotropic etch is used to remove portions of the second conductive member 122 and spacer 133 as shown in FIG. 13. During this etch process, a portion of the first conductive member 13 may be removed, thereby forming a recession 141 within the first conductive member 13. The first conductive member 13 may need to be relatively thicker that the second conductive member 122 and spacer 133. For example, the first conductive member may have a thickness of about 1500 angstroms and the second conductive member 122 and spacer 133 may be formed from layers that are about 500 angstroms thick. The second conductive member 122 and the spacer 133 must be thick enough so that adequate mechanical support exists.

After etching away the exposed portions of the second conductive member 122 and spacer 133, the insulating member 123 is removed using one of the previously described methods to form a cavity (not identified in FIG. 13). Note that only a portion of the spacer 133 is removed. At this point in the process, floating gate 144 has been formed and includes the first conductive member 13, the second conductive member 122, and the spacer 133. After removing masking layer 132, an intergate dielectric layer 142 similar to intergate dielectric layer 81 is deposited on all exposed surfaces of the substrate including the floating gates. After forming the intergate dielectric layer 142, word lines 143 are formed such that they completely fill the cavities.

To prevent possible etching problems due to misalignment, isotropic etches may be used. Still, it is not necessary to use an isotropic etchant as an anisotropic etchant may form a relatively small opening. This opening would be adequate if any of the material of the word lines 91 can be deposited and form a continuous film within the cavities.

In an alternate embodiment, the masking layer 42 does not need to be present over the substrate 10 when forming the cavity 52. If the masking layer 42 is removed, the material within the subsequently formed cavity must be selectively removed with respect to the field isolation regions 11 and the conductive members 13, 22, and 31. As previously stated, member 21 may be titanium that can be removed using ammonium hydroxide and hydrogen peroxide. In yet another embodiment, doped oxide that has not been densified (exposed to a temperature higher than 800 degrees Celsius) may be used for member 21. The doped oxide typically etches at a faster rate compared to the field isolation regions 11 if they include thermal oxide. Still, if erosion of the field isolation regions 11 is a concern, the etch should be performed with the masking layer 42 in place.

Multi-Tiered Floating Gate

Figure 14:
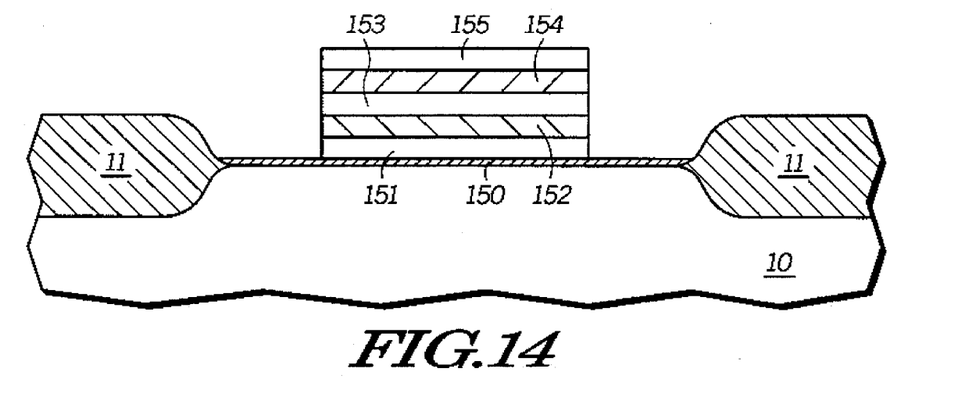
FIGS. 14–18 include illustrations of cross-sectional views of a portion of a semiconductor substrate illustrating the formation for a multi-tiered floating gate.

FIG. 14 includes an illustration of a cross-sectional view of a portion of a semiconductor substrate 10 having field isolation regions 11. A gate dielectric layer 150 is formed over the substrate 10 and between the field isolation regions 11. Members 151–155 are formed over the gate dielectric layer 150. Members 151, 153, and 155 are conductive and include a silicon or metal-containing material. Members 152 and 154 may include an insulating material or any other material that could be used for the member 21 of a previously described embodiment. Unlike previous embodiments, the conductive members 151, 153, and 155 do not completely extend between the field isolation regions 11.

Figure 15:
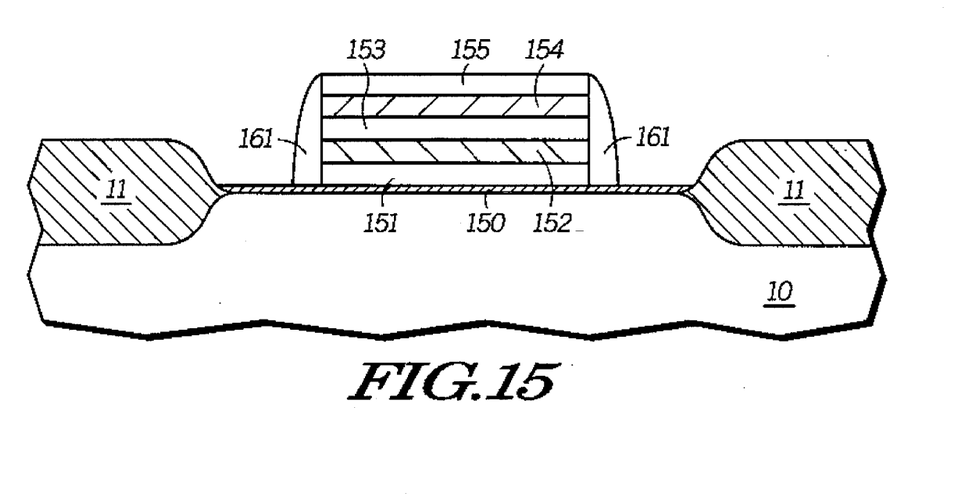

A sidewall spacer 161 is then formed adjacent to the members 151–155 as shown in FIG. 15. The spacer 161 is similar to the spacers 31 described in a previously embodiment.

Figure 16:
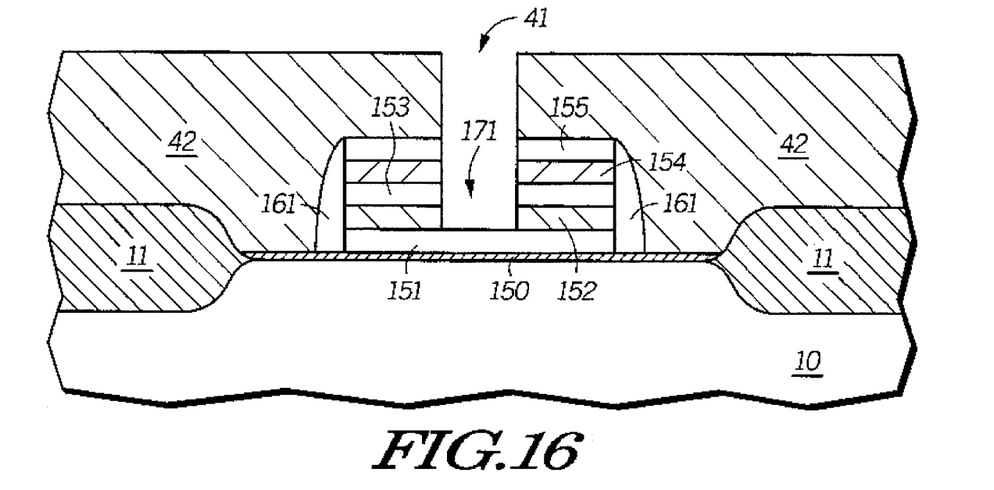

A masking layer 42 including an opening is formed over members 151–155 and spacer 161. The members 153–155 are sequentially etched during the same etching sequence or a separate etching sequence to form the opening 171 that extends through the members 153 and 155, as shown in FIG. 16. While the masking layer 42 is in place over the substrate, an isotropic etching step similar to the one described previously for removing the insulating member 21 is performed to remove the insulating members 152 and 154 to form the cavity 181. After the insulating members 152 and 154 are removed, the masking layer 42 is also removed. The combination of members 151, 153, and 155 and spacer 161 forms a floating gate.

Figure 17:
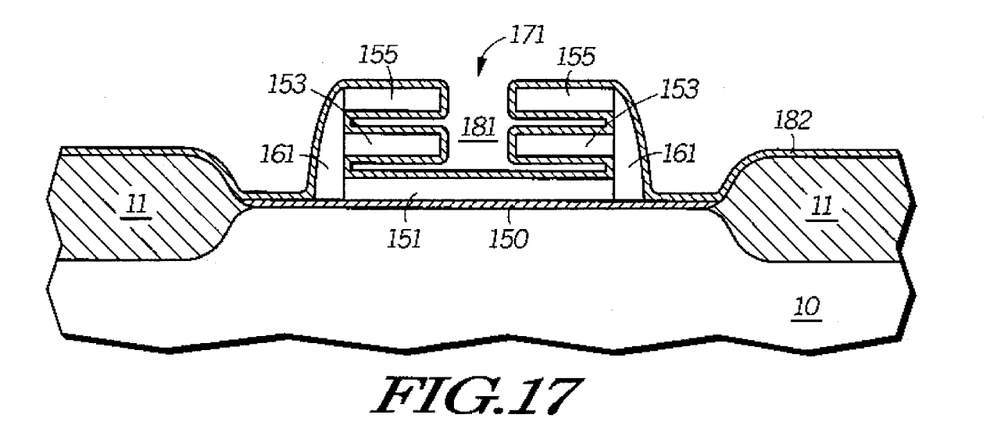
Figure 18:
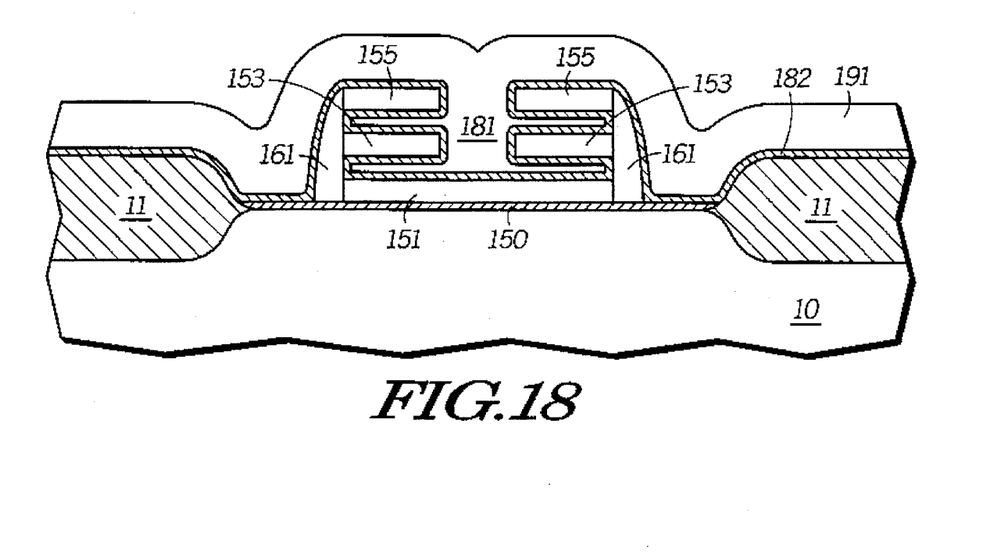

An intergate dielectric layer 182 is then formed over the substrate including the exposed surfaces of the members 151, 153, and 155 and spacer 161 as shown in FIG. 17. After forming the intergate dielectric layer 182, a word line 191 is formed as shown in FIG. 18. Subsequent processing after this point in the process sequence is similar to the processing steps used in the previous embodiments.

This embodiment allows the capability of forming a multi-tiered floating gate structure that may have significantly more capacitive coupling between the floating and control gates compared to a previous embodiment. Still, both this and the previous embodiments allow an increase in capacitive coupling compared to many other prior art memory cells.

Each of first conductive members 13 and 151 may have a length that extends between and partly over the field isolation regions 11 or may have a length that extends only partly between any two field isolation regions 11. If the first conductive members 11 have lengths that extend only partly between any field isolation regions 11, the drain and source regions 93 and 94 should not be formed until after the word lines 91 or 191 are formed. Also, the device may require contacts to be made to memory cells within the memory array instead of using a contactless array. In any event, the present invention is flexible to allow a device designer many options.

Benefits

The increased surface area between the floating gate and control gate allows higher capacitive coupling between the floating and control gates. The higher capacitive coupling allows the floating gate to be programmed and erased more efficiently or at lower potentials. Also, the increased coupling occurs without having to increase the substrate area occupied by the memory cells. Also, the structures may be used in EPROM, EEPROM, and flash EEPROM arrays.

The multi-tiered floating gate allows the capacitive coupling to be even further increased without occupying additional area. Other considerations, such as too great of a step height, yield loss from too many steps, etc., may limit how many tiers can be formed.

Another benefit is that the formation of the cavities has good process margin. As previously discussed, the masking layer to form openings in the second conductive members 22 prior to forming the cavities may be misaligned, so that the openings extend over the edges of the second conductive members 22. The first conductive members 13 may need to be thicker to prevent etching through the first conductive members 31 prior to forming the opening. Also, the cavities 52 and 181 may be partially or completely filled. Any voids formed within the cavities should not cause reliability or data retention problems.

The EPROM, EEPROM, or flash EEPROM cells may be programmed or erased using hot carrier injection, Fowler-Nordheim tunneling, or the like. The layout or some processing steps may need modification, but these have previously been described.

In the foregoing specification, the invention has been described with reference to specific embodiments thereof. However, it will be evident that various modifications and changes can be made thereto without departing from the broader spirit or scope of the invention as set forth in the o appended claims. Accordingly, the specification and drawings are to be regarded in an illustrative rather than a restrictive sense.

What is claimed is:

1. A process for forming an electrically programmable read-only memory cell comprising the steps of:

forming a floating gate over a semiconductor substrate, wherein:
the floating gate has a first member, a second member, and a third member that define a cavity; and
the cavity overlies the first member, underlies the second member, and lies adjacent to the third member;

forming an intergate dielectric layer adjacent to the floating gate and within the cavity; and forming a control gate adjacent to the intergate dielectric layer, wherein a portion of the control gate lies within the cavity.

2. The process of claim 1, further comprising a step of forming an opening extending through a portion of the floating gate, wherein:

this step is performed prior to the step of forming the intergate dielectric layer, wherein:
the opening extends through at least one of the second and third members to the cavity; and
the cavity has a cavity width and the opening has an opening width that is narrower than the cavity width.

3. The process of claim 1, further comprising steps of:

forming a gate dielectric layer over the substrate prior to the step of forming the floating gate; and forming a first doped region and a second doped region, wherein:
the first and second doped regions lie within the substrate:
a channel region lies within the substrate and between the first and second doped regions; and
at least a portion of the channel region underlies the floating gate.

4. The process of claim 3, wherein the step of forming the first and second doped regions is performed such that at least one of the first and second doped regions underlies the control gate but not the floating gate.

5. The process of claim 1, wherein the step of forming the control gate is performed such that the control gate occupies only a portion of the cavity.

6. The process of claim 1, wherein the step of forming the floating gate is performed such that the floating gate further comprises at least one other second member, wherein:

each of the second members overlies the first member and lies adjacent to the third member; and the second members are spaced apart from one another.

7. A process for forming an electrically programmable read-only memory cell comprising the steps of:

forming a floating gate overlying a semiconductor substrate, wherein:
the floating gate includes a cavity;
the floating gate includes a first member, a second member, and a third member;
the first member overlies the substrate;
the second member overlies and is spaced apart from the first member;
the third member is a spacer, wherein the third member lies adjacent an end of the first member and has a vertical surface that is adjacent to the second member; and
the cavity is defined by portions of surfaces of the first, second, and third members;

forming an opening that extends through at least one of the second and third members to the cavity;

forming an intergate dielectric layer lying within the cavity and adjacent to the floating gate; and forming a control gate, wherein at least a portion of the control gate lies within the cavity and is spaced apart from the floating gate by the intergate dielectric layer.

8. The process of claim 1, wherein the step of forming the control gate is performed such that the control gate occupies only a portion of the cavity.

9. The process of claim 7, wherein the step of forming the floating gate is performed such that the floating gate further comprises at least one other second member, wherein:

each of the second members overlies the first member and lies adjacent to the vertical surface of the third member; and the second members are spaced apart from one another.

10. The process of claim 7, wherein:

the step of forming the control gate is performed such that the control gate lies adjacent to a top and a side of the floating gate; and the step of forming the intergate dielectric layer is performed such that the intergate dielectric layer lies between the floating and control gates.

11. The process of claim 7, further comprising steps of:

forming a tunnel dielectric layer between the substrate and the floating gate, wherein the tunnel dielectric layer has a thickness in a range of 50–150 angstroms; and forming doped regions within the substrate and on opposite sides of the control gate.

* * * * *